(12) United States Patent
Draeger et al.

(10) Patent No.: US 9,627,608 B2
(45) Date of Patent: Apr. 18, 2017

(54) DIELECTRIC REPAIR FOR EMERGING MEMORY DEVICES

(71) Applicant: Lam Research Corporation, Fremont, CA (US)

(72) Inventors: Nerissa Draeger, Fremont, CA (US); Thorsten Lill, Santa Clara, CA (US); Diane Hymes, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/483,708

(22) Filed: Sep. 11, 2014

(65) Prior Publication Data

US 2016/0079521 A1    Mar. 17, 2016

(51) Int. Cl.
| | |
|---|---|
| *H01L 21/00* | (2006.01) |
| *H01L 43/12* | (2006.01) |
| *H01L 43/02* | (2006.01) |
| *H01L 43/08* | (2006.01) |
| *H01L 43/10* | (2006.01) |
| *C23C 16/455* | (2006.01) |
| *C23C 16/02* | (2006.01) |

(52) U.S. Cl.
CPC ......... *H01L 43/12* (2013.01); *C23C 16/0227* (2013.01); *C23C 16/45544* (2013.01); *H01L 43/02* (2013.01); *H01L 43/08* (2013.01); *H01L 43/10* (2013.01)

(58) Field of Classification Search
CPC . H01L 43/08; H01L 27/228; H01L 21/28282; H01L 29/4234; H01L 21/02126; H01L 21/02282
See application file for complete search history.

(56) References Cited

U.S. PATENT DOCUMENTS

| | | | |
|---|---|---|---|
| 6,984,585 B2 | 1/2006 | Ying et al. | |
| 7,320,942 B2 | 1/2008 | Chen et al. | |
| 7,582,555 B1 | 9/2009 | Lang et al. | |
| 7,883,739 B2 | 2/2011 | Ivanov et al. | |
| 8,187,951 B1 | 5/2012 | Wang et al. | |
| 8,481,403 B1 | 7/2013 | Gauri et al. | |
| 8,580,697 B1 | 11/2013 | Lang et al. | |
| 8,586,133 B2 | 11/2013 | Ivanov et al. | |
| 8,808,791 B2 | 8/2014 | Ivanov et al. | |
| 8,975,089 B1 * | 3/2015 | Jung | H01L 43/12 257/295 |

(Continued)

OTHER PUBLICATIONS

2006 ECS—The Electrochemical Society; 210th ECS Meeting, Abstract #1705, Title: "A Novel Selective Freelayer Wet Etching Method for Magnetic Tunnel Junction-Based MRAM" , E.J. O'Sullivan; 1 page.

(Continued)

*Primary Examiner* — Phat X Cao
*Assistant Examiner* — David Goodwin

(57) ABSTRACT

Systems and method include providing a non-volatile random access memory (NVRAM) stack including a plurality of layers. The plurality of layers includes a dielectric layer and a metal layer. The metal layer of the NVRAM stack is patterned. The patterning causes damage to lateral side portions of the dielectric layer. The lateral portions of the dielectric layer are repaired by depositing dielectric material on the lateral side portions of the dielectric layer.

22 Claims, 9 Drawing Sheets

(56) References Cited

U.S. PATENT DOCUMENTS

| | | | |
|---|---|---|---|
| 2009/0206427 A1* | 8/2009 | Oh | H01L 43/10 257/421 |
| 2010/0178714 A1* | 7/2010 | Cho | H01L 43/12 438/3 |
| 2011/0235217 A1* | 9/2011 | Chen | H01L 43/12 360/324.2 |
| 2012/0149213 A1 | 6/2012 | Nittala et al. | |
| 2012/0161405 A1 | 6/2012 | Mohn et al. | |
| 2013/0230987 A1 | 9/2013 | Draeger et al. | |
| 2014/0004806 A1* | 1/2014 | Zhou | H01Q 21/06 455/78 |
| 2014/0048108 A9 | 2/2014 | Yun et al. | |
| 2014/0113457 A1 | 4/2014 | Sims et al. | |
| 2014/0120737 A1 | 5/2014 | Swaminathan et al. | |
| 2014/0182636 A1 | 7/2014 | Holsteyns et al. | |
| 2014/0217330 A1* | 8/2014 | Worsley | H01G 11/86 252/504 |
| 2014/0227804 A1* | 8/2014 | Hsu | H01L 43/12 438/3 |
| 2014/0227884 A1 | 8/2014 | Engesser et al. | |

OTHER PUBLICATIONS

Advanced Etch Technology for Nanopatterning II, Proc. of SPIE vol. 8685, 86850 (2003); Title: "STT MRAM Patterning Challenges", 9 pages, Boullart/Radisic/Paraschiv/Cornelissen/Manfrini/Yatsuda/Nishimura/Ohishi/Tahara.

Applied Physics Letters; "Selective Deposition of Silicon by Plasmaenhanced Chemical Vapor Deoposition Using Pulsed Silane Flow", G.N. Parsons; Nov. 11, 1991; p. 2546-2548.

ECS Transactions, vol. 16, Issue 20, 1-18 (2009), Title: "Critical Aspects of Chemical Etch Patterning of Magnetic Tunnel Junction-Based MRAM", E.J. O'Sullivan and D.W. Abraham; 18 pages.

Electrochemical and Solid-State Letters, 7 (5) C64-C66, Mar. 3, 2004, Title: Influence of Wet Chemical Cleaning on Properties of Magetnic Tunnel Junction Stack for Magetic RAM, Song/Park/Kim/Chung.

Journal of Vacuum Science & Technology A; "Plasma Enhanced Selective Area Microcrystalline Silicon Deposition on Hydrogenated Amorphous Silicon: Surface Modification for Controlled Nucleation"; L.L. Smith, W.W. Read, C.S. Yang, E. Srinvasan, C.H. Courtney, H.H. Lamb, and G.N. Parsons; Feb. 2, 1998, 1997; p. 1316-1320.

* cited by examiner

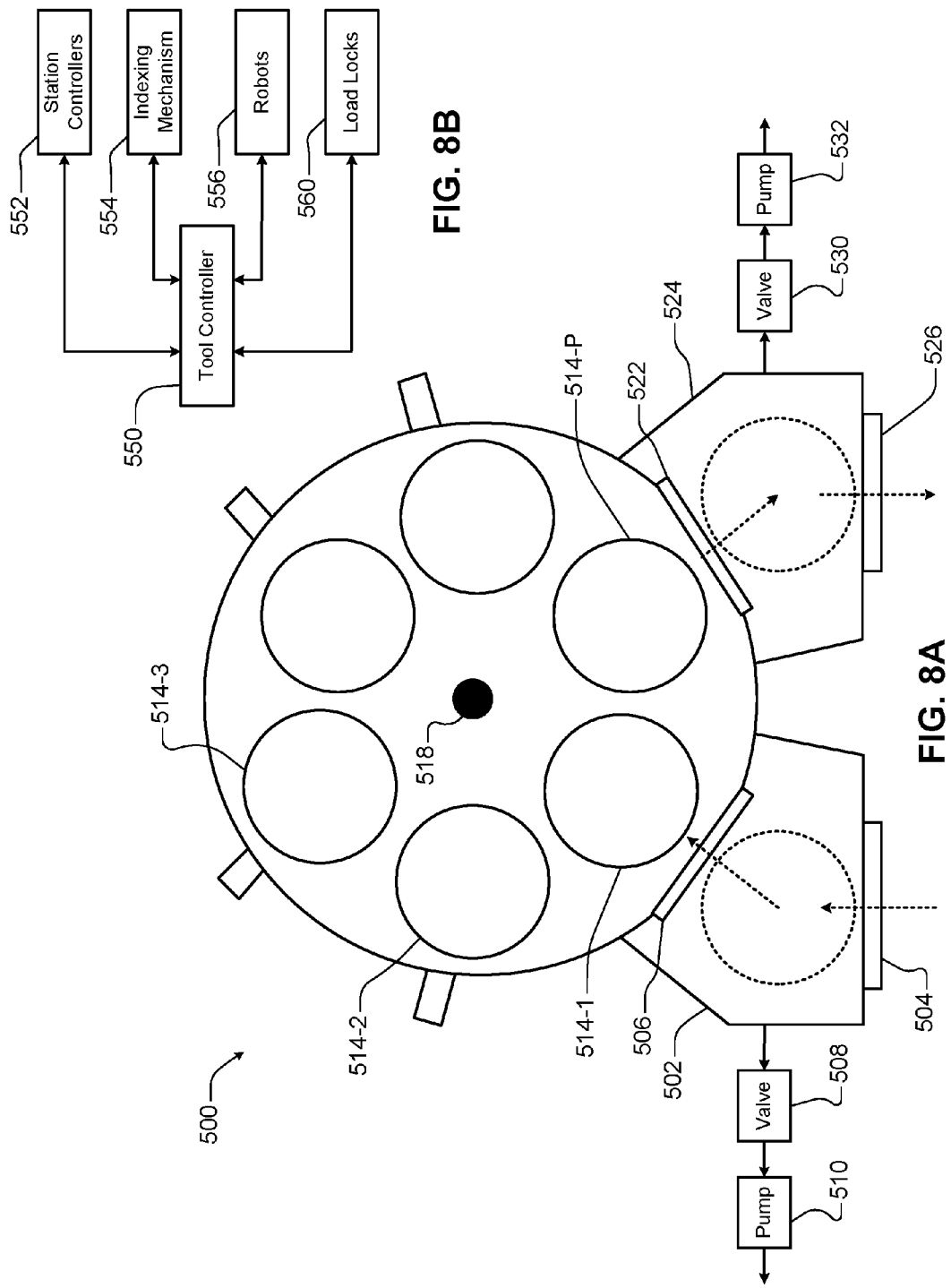

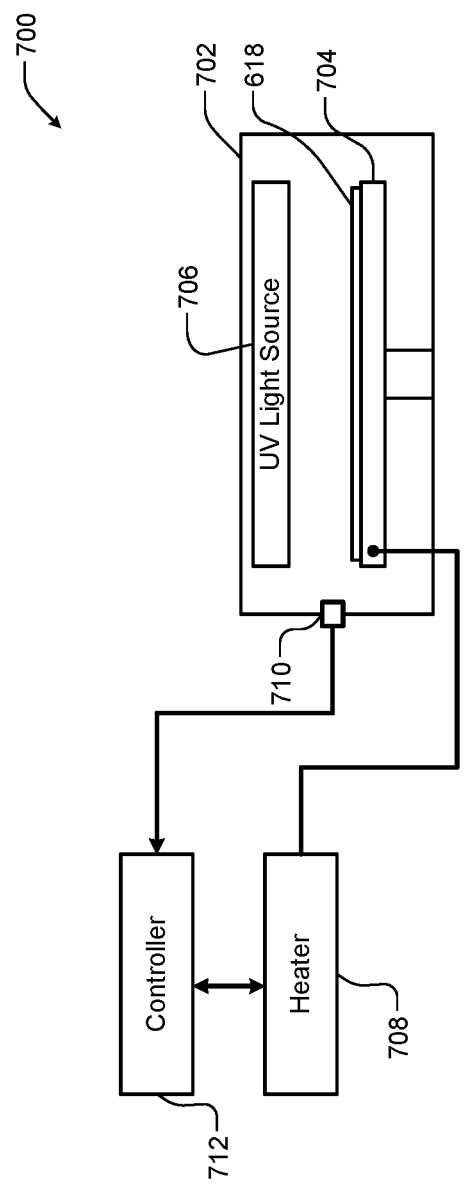

DIELECTRIC REPAIR FOR EMERGING MEMORY DEVICES

FIELD

The present disclosure relates to systems and methods for processing substrates, and more particularly to systems and methods for repairing semiconductor wafers such as memory devices after metal etching and/or cleaning.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electronic devices use integrated circuits including memory to store data. One type of memory that is commonly used in electronic devices is dynamic random-access memory (DRAM). DRAM stores each bit of data in a separate capacitor within the integrated circuit. The capacitor can be either charged or discharged, which represents the two values of a bit. Since non-conducting transistors leak, the capacitors will slowly discharge, and the information eventually fades unless the capacitor charge is refreshed periodically.

Each DRAM cell includes a transistor and a capacitor as compared to four or six transistors in static RAM (SRAM). This allows DRAM to reach very high storage densities. Unlike flash memory, DRAM is volatile memory (vs. non-volatile memory), since data is lost when power is removed.

Several emerging memory devices are potential replacements for DRAM. For example, DRAM replacements include non-volatile RAM (NVRAM) devices such as resistive RAM (RRAM or ReRAM), magnetoresistive RAM (MRAM), ferroelectric RAM (FRAM or FeRAM), spin-transfer torque RAM (STT-RAM), and phase-change RAM (PC-RAM). While the following description refers to STT-RAM, the description applies to other types of NVRAM devices.

Substrate processing systems are used to deposit and etch layers of film on substrates such as a semiconductor wafer. Photoresist and/or hard mask layers may be used during processing to protect underlying layers of the semiconductor wafer during etching. After metal etching is complete, the photoresist and/or hard mask layers are removed. In some situations, the photoresist or hard mask layers may not fully protect underlying layers during metal etching and/or cleaning and portions of one or more of the underlying layers may be damaged, which may cause defects in the layer materials or may cause deficiencies in the memory device.

Referring now to FIGS. 1A to 1C, an example of an MRAM etch sequence is shown. In FIG. 1A, an MRAM stack 10 includes a substrate 14, an oxide layer 18, a bottom electrode 22, a fixed magnetic layer 26, a magnetic tunnel junction (MTJ) layer 30, a free magnetic layer 32, a top electrode 34, and a photoresist mask 38. In FIG. 1B, the MRAM stack 10 is shown after etching of the top electrode 34 and the free magnetic layer 32. In FIG. 1C, a hard mask 42 is deposited over the free magnetic layer 32, the top electrode 34 and the photoresist mask 38. In subsequent steps, the hard mask 42 is used to etch the remaining layers including the oxide layer 18, the bottom electrode 22, the fixed magnetic layer 26 and the MTJ 30.

Referring now to FIG. 2, an example of an SST-RAM stack 50 is shown. The STT-RAM stack 50 may include non-volatile metals that are difficult to etch. The STT-RAM stack 50 includes a bottom electrode 52 including combinations of tantalum (Ta) and/or tantalum nitride (TaN). The STT-RAM stack 50 further includes a fixed or pinned magnetic multi-layer 54 including combinations of platinum (Pt), manganese (Mn), cobalt (Co), iron (Fe), and ruthenium (Ru). The STT-RAM stack 50 further includes a free magnetic multi-layer 60 that includes combinations of nickel (Ni), Fe, Co, palladium (Pd), boron (B) and Ru. The STT-RAM stack 50 further includes a top electrode 62 including Ta and/or TaN. The multi-layers are deposited as thin films and etched to form a vertical pillar. This is just one example and other material combinations are possible for SU-RAM stacks.

The two magnetic multi-layers are separated from each other by a MTJ layer 66 that is typically made of a dielectric material such as magnesium oxide (MgO) or aluminum oxide ($Al_2O_3$). The dielectric material used for the MTJ layer 66 may be a very high-quality and crystalline dielectric material through which the spin-polarized current travels to switch magnetization of the free magnetic multilayer 60. The dielectric material used for the MTJ layer 66 can be etched or otherwise damaged by exposure to plasma etch species such as halides, oxygen, hydrogen or other etchants. Also, the materials in the STT-RAM stack 50 can be degraded when exposed to moisture and aqueous processes. For example, Fe-containing layers (or other easily oxidized metals) may be degraded when exposed to oxygen, moisture or other aqueous processes. The dielectric material used for the MTJ layer 66 is also sensitive to any sidewall deposition during etching because metallic deposits can lead to short circuits.

Because the metal-containing layers in STT-RAM stack 50 and the MTJ layer 66 are sensitive to damage, a limited number of processes and chemicals can be used during the metal etching and/or cleaning steps required to create the vertical pillar. Typical chemical limitations include no halides, hydrogen, oxygen, or aqueous solutions. The chemical limitations eliminate many of the common chemicals used for metal etch or dielectric deposition processes. Furthermore, it is often desirable to have an integrated deposition and etch system so that the stack can be encapsulated before exposure to air.

SUMMARY

A method includes providing a non-volatile random access memory (NVRAM) stack including a plurality of layers. The plurality of layers includes a dielectric layer and a metal layer. The metal layer of the NVRAM stack is patterned. The patterning causes damage to lateral side portions of the dielectric layer. The lateral portions of the dielectric layer are repaired by depositing dielectric material on the lateral side portions of the dielectric layer.

In other features, repairing the dielectric layer includes depositing the dielectric material using flowable film deposition. The flowable film deposition includes hydrolysis of a dielectric precursor followed by condensation to form a networked dielectric.

In other features, repairing the dielectric layer includes depositing the dielectric material using at least one of a selective atomic layer deposition (ALD) process and a selective chemical vapor deposition (CVD) process. The at least one of the selective ALD process and the selective CVD process preferentially deposits film on the dielectric layer relative to the metal layer. The at least one of the selective ALD process and the selective CVD process has a shorter nucleation delay period for the dielectric layer as compared to the metal layer.

In other features, the NVRAM stack includes one of resistive RAM, magnetoresistive RAM, ferroelectric RAM, spin-transfer torque RAM, and phase-change RAM. The method further includes cleaning the NVRAM stack after the patterning processes and prior to the repairing. The cleaning comprises at least one of: removing metal residue on at least a portion of the NVRAM stack; and removing non-metal etch residues on at least a portion of the NVRAM stack.

In other features, the method includes pre-treating the NVRAM stack after the patterning and prior to the repairing. The pre-treating comprises at least one of: creating a surface termination to a portion of the NVRAM stack; and adding a surface species or atomic layer to a portion of the NVRAM stack.

In other features, the surface species or atomic layer is deposited on the dielectric layer to enhance deposition of the dielectric material. The surface species or atomic layer is deposited on the metal layer to inhibit deposition of the dielectric material on the metal layer.

In other features, the NVRAM stack comprises spin-transfer torque RAM. The NVRAM stack comprises first and second magnetic multi-layer stacks that are separated by a magnetic tunnel junction (MTJ) layer corresponding to the dielectric layer. The MTJ layer includes one of magnesium oxide (MgO) and aluminum oxide ($Al_2O_3$).

In other features, the method includes curing the dielectric material after the repairing. The curing comprises at least one of thermal treatment and ultraviolet (UV)-assisted thermal treatment. The curing at least one of initiates or completes chemical conversion of the dielectric material. The curing performs dielectric cross-linking of the dielectric material with the dielectric layer. The curing initiates dielectric recrystallization of the dielectric material.

In other features, the dielectric layer includes a first dielectric material. During the repairing, the dielectric layer of the NVRAM stack is recessed laterally by etching to remove a portion of the first dielectric material. The method includes replacing the removed portion of the first dielectric material with a second dielectric material.

In other features, the NVRAM stack comprises spin-transfer torque RAM, and the NVRAM stack comprises first and second magnetic multi-layer stacks that are separated by a magnetic tunnel junction (MTJ) layer corresponding to the dielectric layer. The method includes flowing tunnel current through the dielectric material during use.

In other features, the etching to laterally recess the dielectric layer includes at least one of wet etching or dry etching. The patterning and dielectric repairing are performed in one or more modules of a single substrate processing tool without intervening exposure to air.

A substrate processing tool includes a first processing station to receive a non-volatile random access memory (NVRAM) stack including a plurality of layers. The plurality of layers includes a dielectric layer and a metal layer. The first processing station patterns the metal layer of the NVRAM stack. The patterning causes damage to lateral side portions of the dielectric layer. A second processing station repairs the lateral portions of the dielectric layer by depositing dielectric material on the lateral side portions of the dielectric layer.

In other features, the second processing station repairs the dielectric layer by depositing the dielectric material using flowable film deposition. The flowable film deposition includes hydrolysis of a dielectric precursor followed by condensation to form a networked dielectric. The second processing station repairs the dielectric layer by depositing the dielectric material using at least one of a selective atomic layer deposition (ALD) process and a selective chemical vapor deposition (CVD) process.

In other features, the at least one of the selective ALD process and the selective CVD process preferentially deposits film on the dielectric layer relative to the metal layer. The at least one of the selective ALD process and the selective CVD process has a shorter nucleation delay period for the dielectric layer as compared to the metal layer. The NVRAM stack includes one of resistive RAM, magnetoresistive RAM, ferroelectric RAM, spin-transfer torque RAM, and phase-change RAM.

In other features, a third processing station cleans the NVRAM stack after the patterning processes and prior to the repairing. The cleaning comprises at least one of: removing metal residue on at least a portion of the NVRAM stack; and removing non-metal etch residues on at least a portion of the NVRAM stack.

In other features, a third processing station pre-treats the NVRAM stack after the patterning and prior to the repairing. The pre-treating comprises at least one of creating a surface termination to a portion of the NVRAM stack; and adding a surface species or atomic layer to a portion of the NVRAM stack.

In other features, the surface species or atomic layer is deposited on the dielectric layer to enhance deposition of the dielectric material. The surface species or atomic layer is deposited on the metal layer to inhibit deposition of the dielectric material on the metal layer.

In other features, the NVRAM stack comprises spin-transfer torque RAM. The NVRAM stack comprises first and second magnetic multi-layer stacks that are separated by a magnetic tunnel junction (MTJ) layer corresponding to the dielectric layer. The MTJ layer includes one of magnesium oxide (MgO) and aluminum oxide ($Al_2O_3$).

In other features, a third processing station cures the dielectric material after the repairing. The curing comprises at least one of thermal treatment and ultraviolet (UV)-assisted thermal treatment. The curing at least one of initiates or completes chemical conversion of the dielectric material. The curing performs dielectric cross-linking of the dielectric material with the dielectric layer. The curing initiates dielectric recrystallization of the dielectric material.

In other features, the dielectric layer includes a first dielectric material. During the repairing in the second processing station, the dielectric layer of the NVRAM stack is recessed laterally by etching to remove a portion of the first dielectric material. A third processing station replaces the removed portion of the first dielectric material with a second dielectric material.

In other features, the NVRAM stack comprises spin-transfer torque RAM, and the NVRAM stack comprises first and second magnetic multi-layer stacks that are separated by a magnetic tunnel junction (MTJ) layer corresponding to the dielectric layer, and wherein tunnel current flows through the dielectric material during use.

In other features, the etching to laterally recess the dielectric layer includes at least one of wet etching or dry etching. The NVRAM stack is moved between the first and second processing stations without intervening exposure to air.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 8A and 8B are functional block diagrams of an example of a substrate processing tool;

FIG. 10 is an example of another processing station of the substrate processing tool.

In the drawings, reference numbers may be reused to identify similar and/or identical elements.

DETAILED DESCRIPTION

In some examples, the systems and methods according to the present disclosure use dielectric repair steps in a non-volatile RAM (NVRAM) integration flow after performing a metal etching process and/or cleaning process. Additional freedom is provided for optimization of the metal etching and/or cleaning steps due to the ability to repair the dielectric layer or replace damaged material in the dielectric layer after damage occurs. As described above, these steps are currently constrained in order to minimize damage to the dielectric layer (for example, the metal tunnel junction (MTJ) layer 30 in STT-RAM devices). If damage to the dielectric layer can be repaired or damaged material replaced, then a greater variety of metal etching and/or cleaning processes may be used.

Figure 1A:
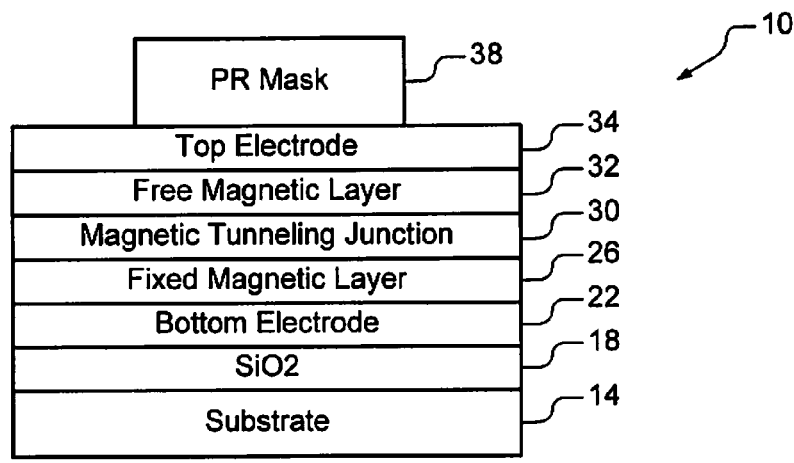
FIGS. 1A-1C illustrate an example of an MRAM stack during metal etching and/or cleaning according to the prior art.
Figure 1B:
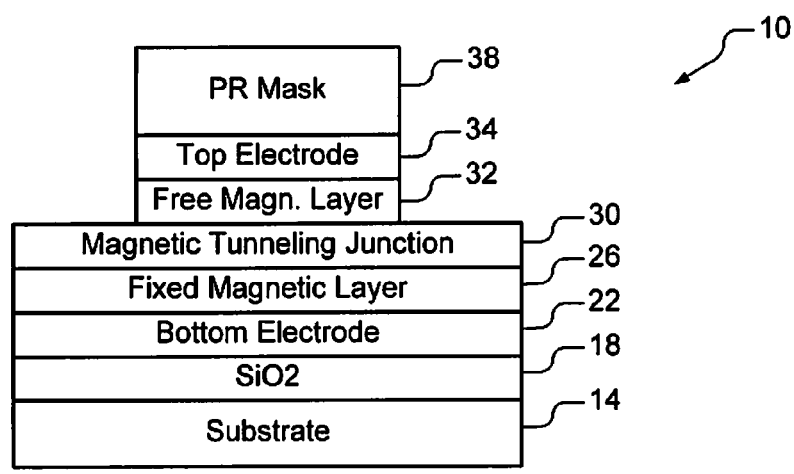
Figure 1C:
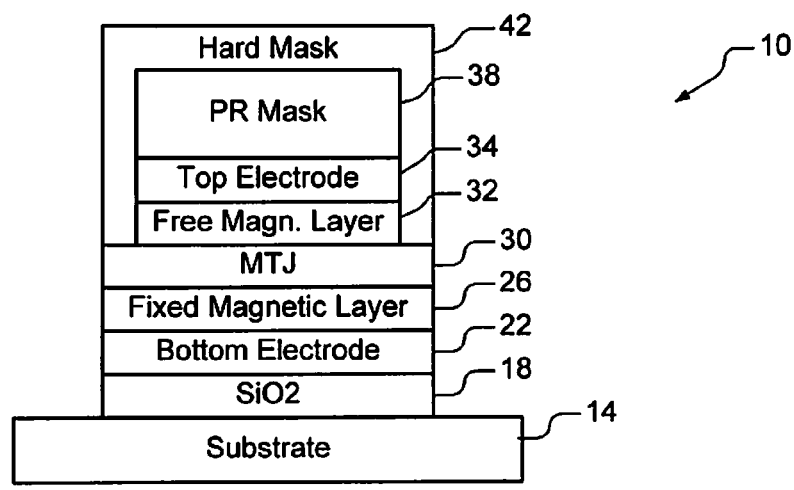
Figure 2:
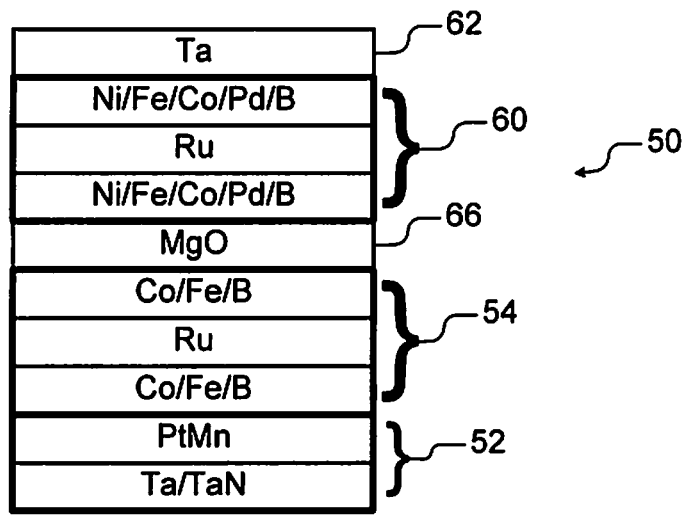
FIG. 2 illustrates an example of an SU-RAM stack according to the prior art.
Figure 3:
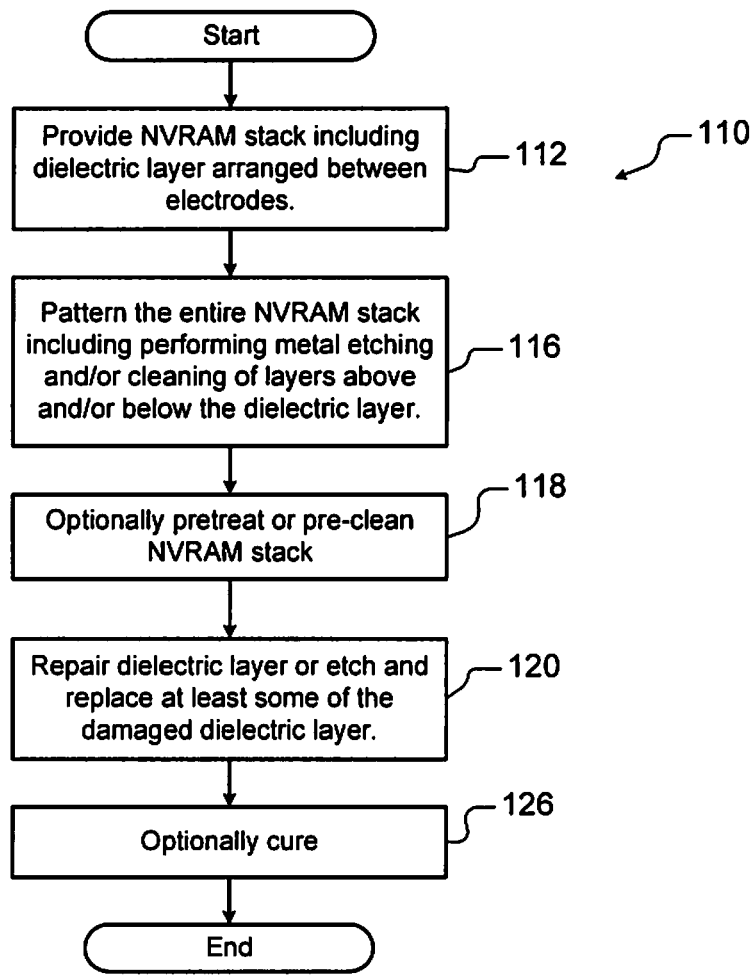
FIG. 3 illustrates an example of a method for repairing or replacing a portion of a dielectric layer of an NVRAM stack after metal etching and/or cleaning according to the present disclosure.

Referring now to FIG. 3, a method 110 for repairing or replacing a portion of a dielectric layer of an NVRAM stack after metal etching and/or cleaning is shown. At 112, an NVRAM stack is provided and includes a dielectric layer such as the MTJ layer arranged between top and bottom electrodes. At 116, the entire NVRAM stack is patterned (including performing metal etching and/or cleaning of layers above and/or below the dielectric layer). At 118, a pretreatment or pre-cleaning step may be performed on the NVRAM stack. At 120, the damaged dielectric layer is repaired or a portion of the damaged dielectric layer is etched and replaced. At 126, the NVRAM stack is cured.

In some examples, dielectric repair may be accomplished using a selective flowable film process. For example, suitable selective flowable film processes are described in commonly-assigned U.S. Pat. No. 8,187,951, entitled "CVD Flowable Gap Fill", issued on May 29, 2012; commonly-assigned U.S. Patent Publication No. 2012/0149213, entitled "Bottom Up Fill in High Aspect Ratio Trenches", published on Jun. 14, 2012; commonly-assigned U.S. Patent Publication No. 2012/0161405, entitled "System and Apparatus for Flowable Deposition in Semiconductor Fabrication", published on Jun. 28, 2012; commonly-assigned U.S. Pat. No. 8,481,403, entitled "Flowable Film Dielectric Gap Fill Process", issued on Jul. 9, 2013; commonly-assigned U.S. Pat. No. 8,580,697, entitled "CVD Flowable Gap Fill", issued on Nov. 12, 2013, which are all hereby incorporated herein by reference in their entirety.

Examples of selective CVD deposition include commonly assigned U.S. Pat. No. 7,883,739, which is entitled "Method for Strengthening Adhesion Between Dielectric Layers Formed Adjacent to Metal Layers" and issued on Feb. 8, 2011; U.S. Pat. No. 8,586,133 which is entitled "Method for Strengthening Adhesion Between Dielectric Layers Formed Adjacent to Metal Layers" and issued on Nov. 19, 2013; and U.S. Pat. No. 8,808,791 which is entitled "Method for Strengthening Adhesion Between Dielectric Layers Formed Adjacent to Metal Layers" and issued on Aug. 19, 2014, which are all hereby incorporated herein by reference in their entirety. Examples of ALD include commonly-assigned US Patent Application Serial Nos. 2014/0120737, which is entitled "Sub-saturated Atomic Layer Deposition and Conformal Film Deposition" and which published on May 1, 2014; and 2014/0113457, which is entitled "Plasma Enhanced Atomic Layer Deposition with Pulsed Plasma Exposure" and which published on Apr. 24, 2014. Additional examples of selective deposition include "Selective deposition of silicon by plasma enhanced chemical vapor deposition using pulsed silane flow," G. N. Parsons et al., Applied Physics Letters, 59, 2458-2546, 1991; and "Plasma enhanced selective area microcrystalline silicon deposition on hydrogenated amorphous silicon: Surface modification for controlled nucleation," L. L. Smith, W. W. Read, C. S. Yang, et al., Journal of Vacuum Science & Technology A, 16(3):1316-1320, 1998.

As can be appreciated, other deposition processes may be used as long the process is selective to deposition on the existing dielectric layer rather than on the exposed metal layers and produces high quality dielectric materials. In some examples, the dielectric repair or replacement module is located on the same tool system as the etch modules so that there is no air break between metal etching and dielectric repair processes.

In some examples, the systems and methods described in the present disclosure use dielectric repair steps after performing the metal etch and/or clean processes. This approach enables simpler and more varied etch processes that cause some dielectric damage and then repair steps are used to improve the quality of the damaged dielectric layer to an acceptable level.

The kind of repair process that is needed depends on the type of dielectric material and the damage that is created. The damage may include undercutting the dielectric layer due to removal of material, creation of pits or pores in the dielectric material exposed to the etch process, excessive oxidation of the dielectric leading to a non-stoichiometric composition, preferential removal of the "metal" atoms in the dielectric leading to a non-stoichiometric composition (e.g., removal of Mg from MgO), hydrogenation of the dielectric leading to M-OH species in the material (where M may be Mg, Al, etc.), and damage to the dielectric crystal structure such as a change to the crystal orientation or creation of amorphous material.

In some examples, the dielectric repair is performed by the flowable film process. In the flowable film process, the deposition process may proceed by sol-gel hydrolysis and condensation reactions that are a known reaction pathway for many dielectrics. The sol-gel process involves hydrolysis of a dielectric precursor (e.g., conversion of magnesium ethoxide, $Mg(OC_2H_5)_2$ into $Mg(OH)_2$), incorporation of dielectric monomers into a colloidal solution (sol) (e.g., $Mg(OH)_2$ in water, alcohol and/or other solvents) that acts as the source for an integrated network (or gel) once condensation reactions lead to formation of a dielectric polymer. Although this may also be called a flowable oxide process, the process can be used to deposit materials other than oxides. More particularly, the flowable film process can also deposit nitrides, oxynitrides, perovskites and more (e.g., silicon dioxide ($SiO_2$), SiON, SiCOH, magnesium peroxide (MgO), aluminum oxide ($Al_2O_3$), lead zirconium titanate (PZT), barium strontium titanate (BST)).

Although the most common hydrolysis agent is water, the deposition can also be conducted in non-aqueous mixtures (i.e., mixtures that do require water). Examples of other non-aqueous hydrolysis agents include acids, alcohols, ethers, glycols, acetates and amines.

The flowable film process can be used to selectively deposit dielectric material only on the existing dielectric, not on exposed metal-containing layers. The flowable film process has a shorter nucleation delay, or incubation time, for deposition on dielectric materials (e.g. silicon (Si), silicon dioxide ($SiO_2$), magnesium dioxide (MgO), aluminum oxide (Al2O3), ultra-low k dielectric (ULK)) as compared to some metals (e.g., Cu, Co), which means that there is a window of selective deposition.

The flowable film process can also be used to selectively deposit in small, recessed features relative to deposition on flat, open surfaces and is not dependent on feature or surface orientation. Due to the capillary condensation nature, the flowable film process deposits preferentially in the smallest features (e.g. trenches, vias). This means that the film will deposit and fill undercut regions or pores in the damaged dielectric without depositing a continuous film on the field or sidewall regions. Parameters of the flowable oxide process are primarily controlled by substrate temperature, reactant flow rates, chamber pressure, reactant partial pressures, type and concentration of reactants, as well as type and concentration of catalysts.

In other features, other processes are used to effectuate the dielectric repair such as a selective CVD, ALD or solution-based processes.

In some examples, metal residues remain on the sidewall after etching and the metal residues are removed using a cleaning step after etch and prior to the dielectric repair step. Examples of post-etch clean steps are disclosed in commonly assigned U.S. Patent Application Serial Nos. 2014/0048108 which is entitled "Method of Dielectric Film Treatment" and which published on Feb. 20, 2014; 2014/0182636 which is entitled "Method and Apparatus for Processing Wafer-shaped Articles" and which published on Feb. 20, 2014; and 2014/0227884 which is entitled "Process and Apparatus for Treating Surfaces of Wafer-Shaped Articles" and which published on Aug. 14, 2014, which are all hereby incorporated herein by reference in their entirety.

The subsequent repair step deposits new, high-quality dielectric material or repairs the damaged dielectric by making the layer stoichiometric and by eliminating dangling bonds or by recrystallization. The repair step is not intended to remove etch residues, which may inhibit dielectric deposition or leave undesirable material on the surface, nor to remove metal residues, which may lead to electrical shorts. Therefore, the dielectric repair process may include multiple steps, not just the dielectric deposition step.

After the etch and/or clean step, a pre-treatment step may be needed prior to deposition to prepare the exposed dielectric or metal-containing surfaces (i.e., remove surface contaminants or add a desired surface species). A pre-treatment step may also be used to enhance the deposition selectivity such that the new deposition occurs only on the existing dielectric and not on the exposed metal surfaces. A selectivity pre-treatment may be used to treat either the existing dielectric surfaces or the metal surfaces (i.e., the pre-treatment enhances deposition on dielectric surfaces or blocks deposition on metals). In some examples, hydrophilic surface species will reduce the nucleation delay of the flowable film process. Hydrophobic surface species generally have the opposite effect and increase the nucleation delay. A hydrophilic surface termination may be created on the existing dielectric surfaces and/or a hydrophobic surface termination may be created on the existing metal surfaces. In one example, the dielectric surface may be exposed to a hydrophilic vapor to increase hydrophilicity (e.g. a hydrogen-containing gas that forms a Mg—OH surface termination on the existing MgO). In another example, the metal surface may be exposed to a hydrophobic species to increase its hydrophobicity. These examples promote a shorter nucleation delay on the existing dielectric surfaces than on the exposed metal surfaces to enhance selectivity of the flowable film deposition. The pre-treatment step may be vapor-phase or solution-based processes. A vapor-phase pre-treatment may comprise an inert gas, a chemically reactive gas or species from a remote or direct plasma. The pre-treatment vapor may be created from a liquid that has been vaporized and delivered to the surface as a gas. A solution-based process may be used to create a self-assembled monolayer on either or both of the existing dielectric and metal surfaces. The self-assembled monolayer can be modified to have a hydrophilic or hydrophobic end group to control the surface species exposed to the subsequent flowable film deposition.

In some examples, a cure step is performed after the deposition step. The cure step may be used to remove by-products or excess reactants from the newly-deposited dielectric, to further dielectric cross-linking, to initiate dielectric recrystallization and/or to improve other material qualities. For example, curing may be used to densify the dielectric. In another example, curing may be used to convert the dielectric from amorphous or poly-crystalline to a single crystal. Curing may also be used to initiate or complete a chemical conversion. For example, if a $MgO_xN_y$ material is deposited during the dielectric repair step then the cure step may be used to fully convert the material to MgO. In some examples, the cure step includes a thermal treatment, UV-assisted thermal treatment, plasma-assisted thermal treatment or other curing method and may be conducted in an inert or reactive environment.

Figure 4A:
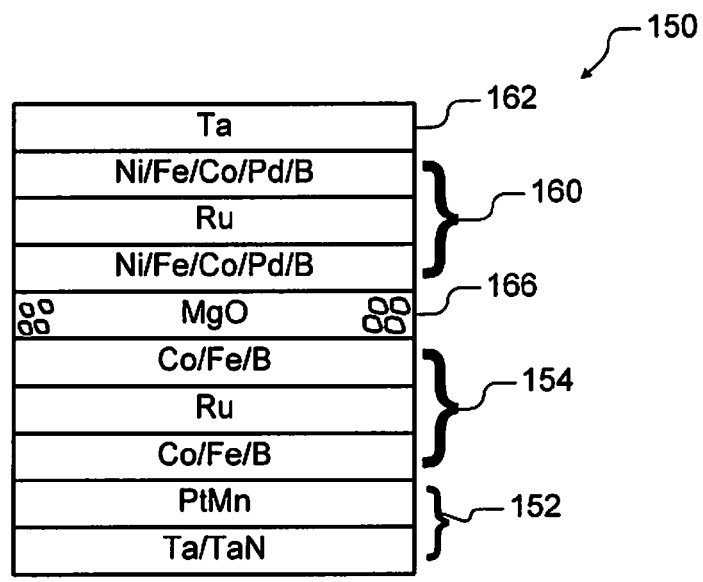
FIG. 4A illustrates an example of an NVRAM stack such as an STT-RAM stack with damage to a dielectric layer such as an MTJ layer after metal etching and/or cleaning.
Figure 4B:
FIG. 4B is an example of a side cross-sectional view of the damaged dielectric layer.
Figure 4C:
FIG. 4C is an example of a side cross-sectional view of the dielectric layer after repair according to the present disclosure.

Referring now to FIGS. 4A-4C, an NVRAM stack 150 such as an STT-RAM stack is shown during processing. The NVRAM stack 150 is shown to include a bottom electrode 152, a fixed magnetic layer 154, a free magnetic layer 160, and a top electrode 162. A dielectric layer 166 such as the MTJ is arranged between the free magnetic layer 160 and the fixed magnetic layer 154.

In FIGS. 4A and 4B, the NVRAM stack 150 is shown with damage to the dielectric layer 166 after metal etching and/or cleaning. In FIG. 4C, the NVRAM stack 150 is shown after the damaged dielectric layer is repaired.

Figure 5A:
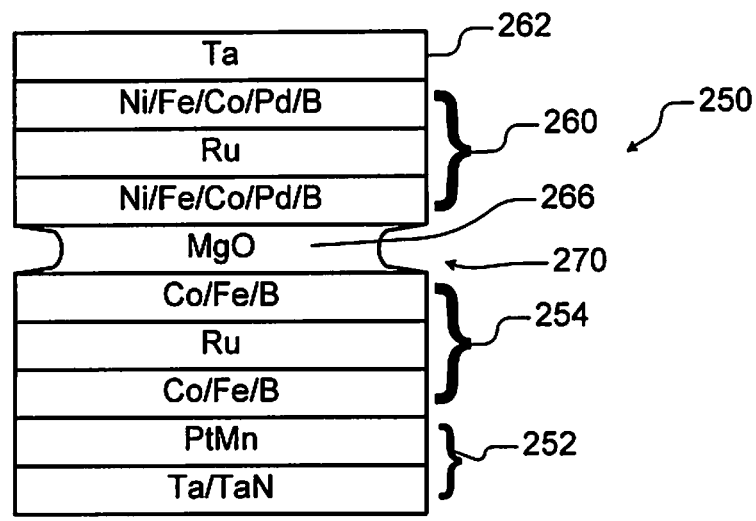
FIG. 5A illustrates an example of an NVRAM stack such as an STT-RAM stack with a portion of the dielectric layer, that was damaged after metal etching and/or cleaning, removed.
Figure 5B:
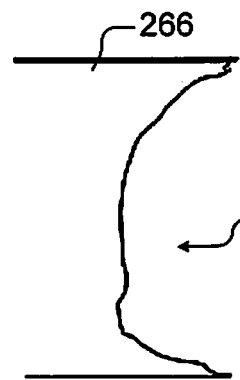
FIG. 5B is an example of a side cross-sectional view of the dielectric layer with the portion removed.
Figure 5C:
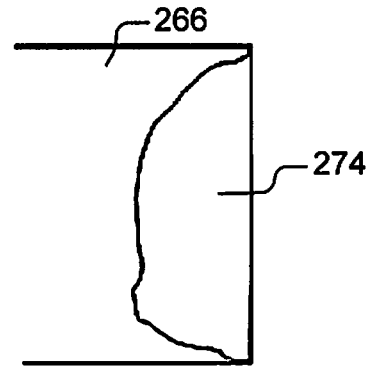
FIG. 5C is an example of a side cross-sectional view of the dielectric layer after part of the damaged portion is replaced according to the present disclosure.

Referring now to FIGS. 5A-5C, an NVRAM stack 250 such as an STT-RAM stack is shown during processing. The NVRAM stack 250 is shown to include a bottom electrode 252, a fixed magnetic layer 254, a free magnetic layer 260, and a top electrode 262. A dielectric layer 266 such as the MTJ is arranged between the free magnetic layer 260 and the fixed magnetic layer 254.

In FIGS. 5A and 5B, the NVRAM stack 150 is shown with damage to the dielectric layer 166 removed to create a recess shown at 270 after metal etching and/or cleaning. In FIG. 5C, the NVRAM stack 150 is shown after the recess 270 is repaired with dielectric material 274.

In other examples, an NVRAM stack with a replaceable oxide layer (located where the dielectric layer will be) is etched. The properties of the replaceable oxide layer are selected to prevent or significantly reduce electrons from tunneling. The replaceable oxide layer is selected to be removed by isotropic wet or dry etch techniques. After patterning of the NVRAM stack, the replaceable oxide layer is recessed laterally as far as possible before structural integrity is adversely impacted. Then the dielectric repair process refills the replaceable oxide layer with high quality oxide. Tunnel current of the NVRAM device flows through the newly embedded material rather than through a center post, which still includes a lower-quality replaceable oxide layer.

Figure 6:
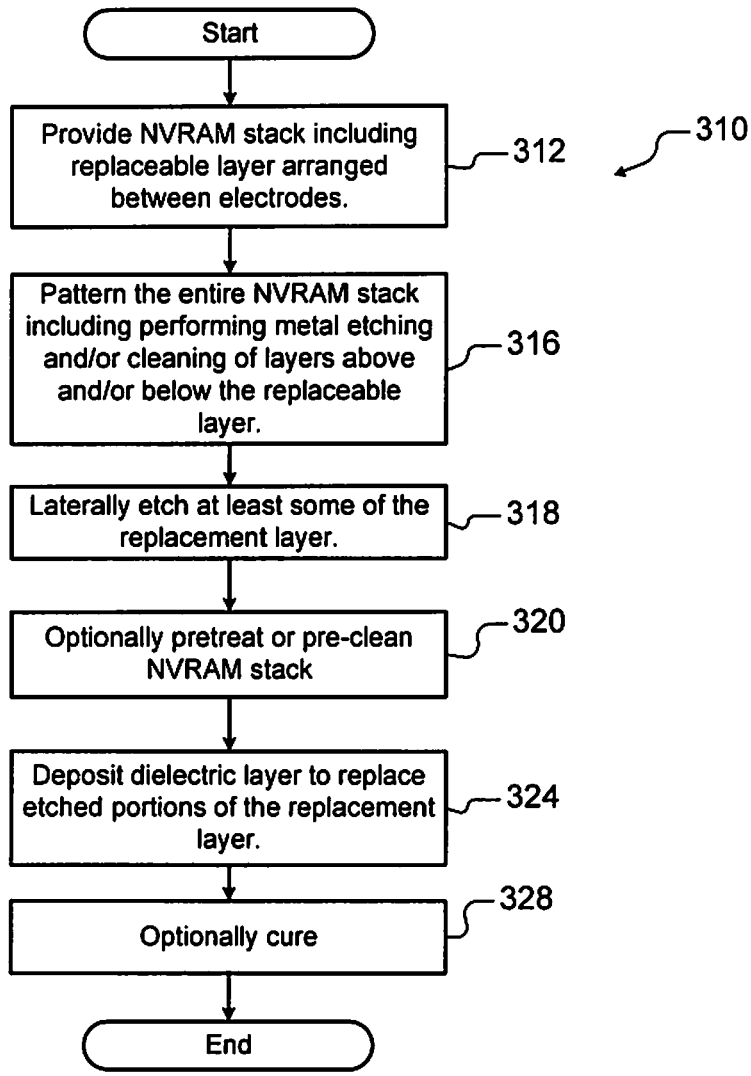
FIG. 6 illustrates an example of a method using an NVRAM stack with a replaceable dielectric layer and laterally etching and replacing a portion of the replaceable dielectric layer after metal etching and/or cleaning according to the present disclosure.

Referring now to FIG. 6, a repair method 310 using an NVRAM stack with a replaceable oxide layer is shown. After incurring damage due to metal etching and/or cleaning, a portion of the replaceable oxide layer is removed and replaced with dielectric material to repair the NVRAM stack. At 312, an NVRAM stack is provided and includes a replaceable oxide layer arranged between top and bottom electrodes and/or the fixed and free magnetic layers. At 316, the NVRAM stack is patterned including performing metal etching and/or cleaning of layers above and/or below the replaceable oxide layer. Damage may occur in the preceding steps.

At 318, lateral etching is performed to remove at least some of the replaceable oxide layer. At 320, the NVRAM stack is optionally cleaned or pre-treated as will be described further below. At 324, dielectric material is deposited to replace the etched portions of the replacement oxide layer. At 328, the NVRAM stack is optionally cured.

Figure 7A:
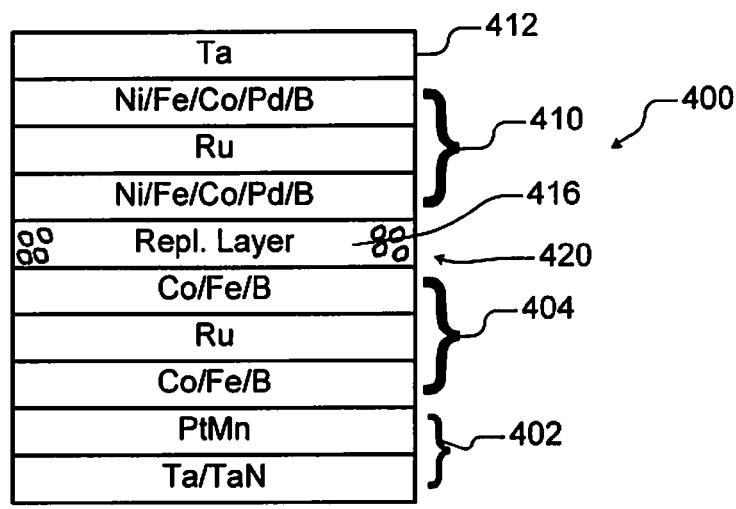
FIG. 7A illustrates an example of an STT-RAM stack with a portion of the dielectric layer, that was damaged after metal etching and/or cleaning, removed.
Figure 7B:
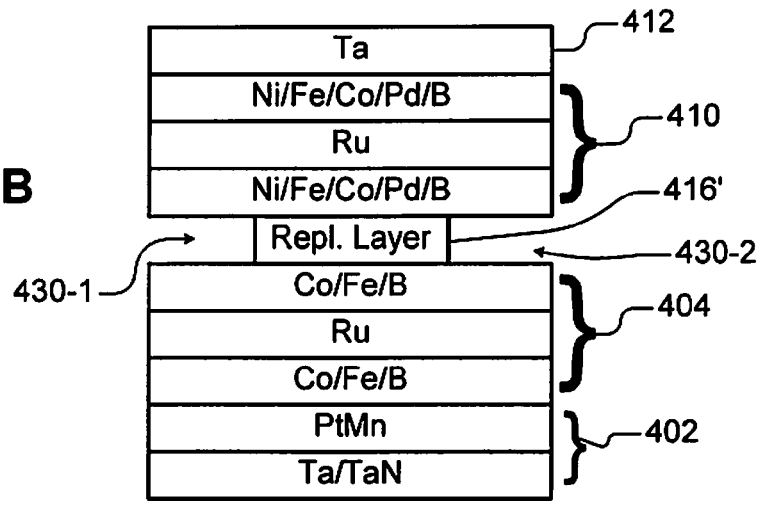
FIG. 7B is an example of a side cross-sectional view of the dielectric layer with the portion removed.
Figure 7C:
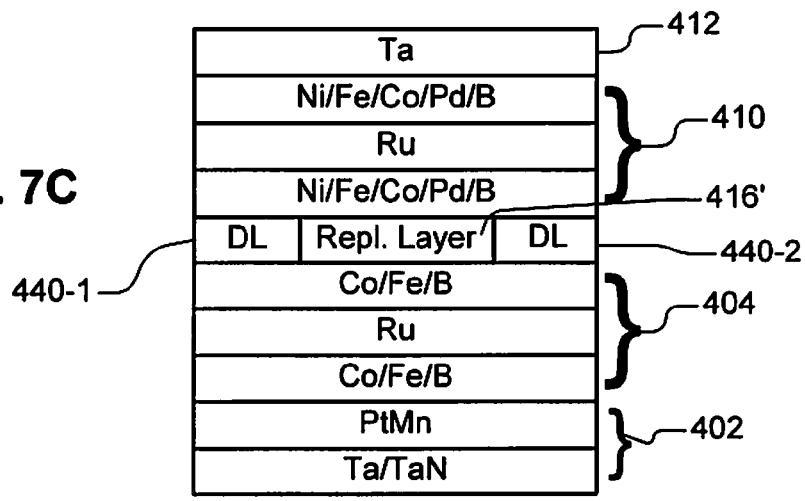
FIG. 7C is an example of a side cross-sectional view of the dielectric layer after part of the damaged portion is replaced according to the present disclosure.

Referring now to FIGS. 7A-7C, an NVRAM stack 400 such as an STT-RAM stack is shown during processing. The NVRAM stack 400 is shown to include a bottom electrode 402, a fixed magnetic layer 404, a free magnetic layer 410, and a top electrode 412. A dielectric layer 416 such as a magnetic tunnel junction is arranged between the free magnetic layer 410 and the fixed magnetic layer 404.

In FIG. 7A, the NVRAM stack 400 is shown with damage to the dielectric layer 416. In FIG. 7B, the damage to the dielectric layer 416' is removed using etching to create a recess shown at 430-1 and 430-2. In FIG. 7C, the NVRAM stack 400 is shown after the recess 430-1 and 430-2 is repaired with dielectric material 440-1 and 440-2.

The flowable film deposition deposits selectively on many dielectric surfaces with little to no deposition on most metal surfaces. The nucleation delay, or incubation time, on different substrates, which determines selectivity between dielectrics and metals, can be affected by choice of precursor, catalyst and pre-treatment. For example, for flowable low-k SiCOH there is good selectivity for deposition on ULK dielectrics with no deposition on Cu or Co.

Flowable film deposition can also be controlled to selectively deposit in smaller features without deposition in larger features or on blanket surfaces. Capillary condensation of the flowable film deposition process occurs for many precursors and process regimes. However, the amount of condensation is controlled by the reactants' partial pressures relative to their saturated vapor pressures (which is constant for a given deposition temperature). The dependence of fill rate on critical dimension can be tuned by varying the partial pressures. Tuning that selectivity will improve the capability to deposit in just the recessed, damaged dielectric regions without deposition on the open spaces or blanket surfaces.

Referring now to FIG. 8A, a functional block diagram illustrating an example of a substrate processing tool 500 is shown. The substrate processing tool 500 includes an input loadlock 502. Substrates are introduced into the input loadlock 502 through a port 504. After the substrate is located in the input loadlock 502, the port 504 and a port 506 are closed and a valve 508 and a pump 510 may be used to reduce pressure in the input loadlock 502 to substantially match a pressure in the substrate processing tool 500.

Thereafter, the port 506 may be opened and a robot or another device may be used to load the substrate into a first one of a plurality of processing stations 514-1, 514-2, . . . , and 514-P (collectively processing stations 514), where P is an integer greater than one. The processing stations 514 may be arranged to perform the processing steps to repair the dielectric layer or to etch and replace at least some of the damaged dielectric layer as described above in FIGS. 3 and 6. One or more of the processing stations 514 may process the substrates using plasma as will be described below.

An indexing mechanism 518 may be used to index the substrate to a subsequent one of the processing stations 514 and another substrate may be loaded into the processing station 514-1. Exposure to plasma is performed in another one of the processing stations (such as 514-2).

Other ones of the processing stations 514 may be used to perform additional processing of the substrate. After processing in the last one of the processing stations 514-P is performed, a robot or other device may be used to remove the substrate through a port 522 to an output loadlock 524. The port 522 is closed and a port 526 is opened to allow the substrate to be removed from the substrate processing tool 500. A valve 530 and pump 532 may be used to control pressure in the output loadlock 524. In other words, prior to opening the port 522, the pressure in the output loadlock 524 may be substantially equalized to the substrate processing tool 500.

Referring now to FIG. 8B, a tool controller 550 communicates with station controllers 552 associated with the processing stations, an indexing mechanism 554 to index the substrates, one or more robots 556 to move the substrates as needed, and one or more load locks 560. The tool controller 550 coordinates movement of the substrates using the indexing mechanism, the robots 556 and the load locks 560 to sequentially process the substrates. The station controllers 552 coordinate processing of the substrates in the processing stations.

Figure 9:
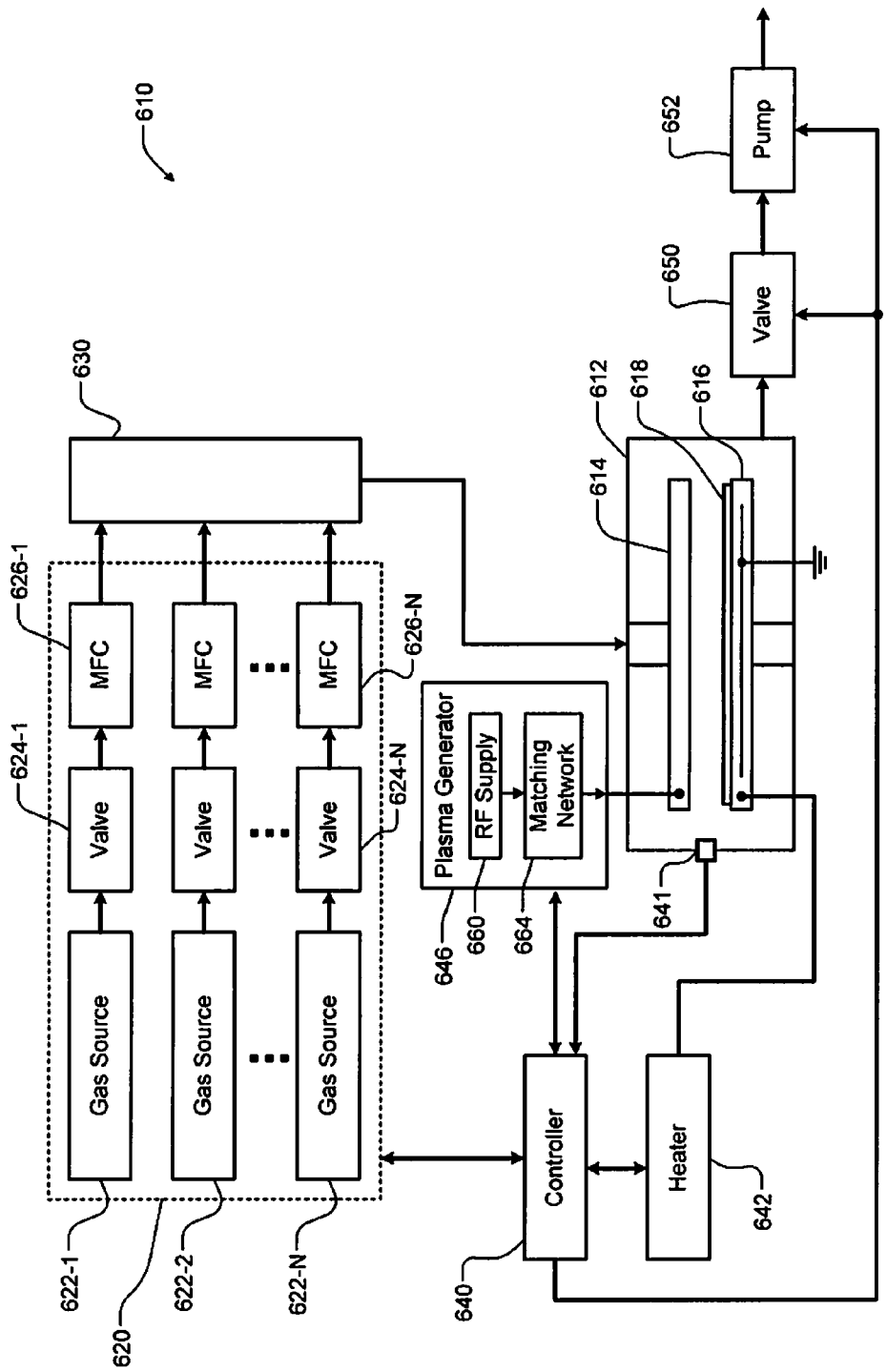
FIG. 9 is an example of a processing station of the substrate processing tool.

Referring now to FIG. 9, an example of one of the processing stations for performing deposition, etch or other processes is shown. A processing station 610 includes a processing chamber 612. Gas may be supplied to the processing chamber 612 using a gas distribution device 614 such as showerhead or other device. A substrate 618 such as a semiconductor wafer may be arranged on a substrate support 616 during processing. The substrate support 616 may include a pedestal, an electrostatic chuck, a mechanical chuck or other type of substrate support.

A gas delivery system 620 may include one or more gas sources 622-1, 622-2, . . . , and 622-N (collectively gas sources 622), where N is an integer greater than one. Valves 624-1, 624-2, . . . , and 624-N (collectively valves 624), mass flow controllers 626-1, 626-2, . . . , and 626-N (collectively mass flow controllers 626), or other flow control devices may be used to controllably supply precursor, reactive gases, inert gases, purge gases, and mixtures thereof to a manifold 630, which supplies the gas mixture to the processing chamber 612.

A controller 640 may be used to monitor process parameters such as temperature, pressure etc. (using sensors 641) and to control process timing. The controller 640 may be used to control process devices such as the gas delivery system 620, a pedestal heater 642, and/or a plasma generator 646. The controller 640 may also be used to evacuate the processing chamber 612 using a valve 650 and pump 652.

The RF plasma generator 646 generates the RF plasma in the processing chamber. The RF plasma generator 646 may be an inductive or capacitive-type RF plasma generator. In some examples, the RF plasma generator 646 may include an RF supply 660 and a matching and distribution network 664. While the RF plasma generator 646 is shown connected to the gas distribution device 614 with the pedestal grounded or floating, the RF generator 646 can be connected to the substrate support 616 and the gas distribution device 614 can be grounded or floating.

Referring now to FIG. 10, an example of a processing station 700 for curing is shown. The processing station 700 includes a processing chamber 702, a substrate support 704 such as a pedestal, an ultraviolet light source 706 and/or a heater 708 to heat the substrate. A sensor 710 may be used to monitor conditions within the processing chamber 702. For example, the sensor 710 may monitor the temperature of the substrate. A controller 712 may be used to control the curing process. The processing station 700 may include a gas delivery system (not shown) to deliver process gas or purge gas.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method comprising:
providing a non-volatile random access memory (NVRAM) stack including a plurality of layers, wherein the plurality of layers includes a dielectric layer and a metal layer;
patterning the metal layer of the NVRAM stack, wherein the patterning causes damage to lateral side portions of the dielectric layer that are recessed relative to the metal layer; and
repairing the lateral portions of the dielectric layer by depositing dielectric material on the lateral side portions of the dielectric layer that are recessed using a deposition process that chemically selectively deposits the dielectric material, with the metal layer exposed to the deposition process, on the side portions of the dielectric layer relative to sidewalls of the metal layer.

2. The method of claim 1, wherein repairing the dielectric layer includes depositing the dielectric material using flowable film deposition.

3. The method of claim 2, wherein the flowable film deposition includes hydrolysis of a dielectric precursor followed by condensation to form a networked dielectric.

4. The method of claim 1, wherein the NVRAM stack includes one of resistive RAM, magnetoresistive RAM, ferroelectric RAM, spin-transfer torque RAM, and phase-change RAM.

5. The method of claim 1, further comprising cleaning the NVRAM stack after the patterning processes and prior to the repairing, wherein the cleaning comprises at least one of:
removing metal residue on at least a portion of the NVRAM stack; and
removing non-metal etch residues on at least a portion of the NVRAM stack.

6. The method of claim 1, further comprising pre-treating the NVRAM stack after the patterning and prior to the repairing, wherein the pre-treating comprises at least one of:
creating a surface termination to a portion of the NVRAM stack; and
adding a surface species or atomic layer to a portion of the NVRAM stack.

7. The method of claim 6, wherein the surface species or atomic layer is deposited on the dielectric layer to enhance deposition of the dielectric material.

8. The method of claim 6, wherein the surface species or atomic layer is deposited on the metal layer to inhibit deposition of the dielectric material on the metal layer.

9. The method of claim 1, wherein:
the NVRAM stack comprises spin-transfer torque RAM, and
wherein the NVRAM stack comprises first and second magnetic multi-layer stacks that are separated by a magnetic tunnel junction (MTJ) layer corresponding to the dielectric layer.

10. The method of claim 9, wherein the MTJ layer includes one of magnesium oxide (MgO) and aluminum oxide ($Al_2O_3$).

11. The method of claim 1, further comprising curing the dielectric material after the repairing.

12. The method of claim 11, wherein the curing comprises at least one of thermal treatment and ultraviolet (UV)-assisted thermal treatment.

13. The method of claim 11, wherein the curing at least one of initiates or completes chemical conversion of the dielectric material.

14. The method of claim 11, wherein the curing performs dielectric cross-linking of the dielectric material with the dielectric layer.

15. The method of claim 11, wherein the curing initiates dielectric recrystallization of the dielectric material.

16. The method of claim 1, wherein:
the dielectric layer includes a first dielectric material, and during the repairing, the dielectric layer of the NVRAM stack is recessed laterally by etching to remove a portion of the first dielectric material.

17. The method of claim 16, further comprising replacing the removed portion of the first dielectric material with a second dielectric material.

18. The method of claim 16, wherein the NVRAM stack comprises spin-transfer torque RAM, and the NVRAM stack comprises first and second magnetic multi-layer stacks that are separated by a magnetic tunnel junction (MTJ) layer corresponding to the dielectric layer, and further comprising flowing tunnel current through the dielectric material during use.

19. The method of claim 16, wherein the etching to laterally recess the dielectric layer includes at least one of wet etching or dry etching.

20. The method of claim 1, wherein the patterning and dielectric repairing are performed in one or more modules of a single substrate processing tool without intervening exposure to air.

21. A method comprising:
providing a non-volatile random access memory (NVRAM) stack including a plurality of layers, wherein the plurality of layers includes a dielectric layer and a metal layer;
patterning the metal layer of the NVRAM stack, wherein the patterning causes damage to lateral side portions of the dielectric layer that are recessed relative to the metal layer; and
repairing the lateral portions of the dielectric layer by depositing dielectric material on the recessed lateral side portions of the dielectric layer using a deposition process that selectively deposits the dielectric material on the side portions of the dielectric layer relative to sidewalls of the metal layer, wherein repairing the dielectric layer includes depositing the dielectric material using at least one of a selective atomic layer deposition (ALD) process and a selective chemical vapor deposition (CVD) process, and wherein the at least one of the selective ALD process and the selective CVD process preferentially deposits film on the dielectric layer relative to the metal layer.

22. The method of claim 21, wherein the at least one of the selective ALD process and the selective CVD process has a shorter nucleation delay period for the dielectric layer as compared to the metal layer.

* * * * *